United States Patent
Ito et al.

(10) Patent No.: US 7,466,159 B2
(45) Date of Patent: Dec. 16, 2008

(54) SEMICONDUCTOR INTEGRATED CIRCUIT HAVING MULTIPLE SEMICONDUCTOR CHIPS WITH SIGNAL TERMINALS

(75) Inventors: Naoki Ito, Nukata-gun (JP); Hideaki Ishihara, Okazaki (JP); Yoshinori Teshima, Toyota (JP); Chikara Kobayashi, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 85 days.

(21) Appl. No.: 11/586,560

(22) Filed: Oct. 26, 2006

(65) Prior Publication Data
US 2007/0108998 A1 May 17, 2007

(30) Foreign Application Priority Data
Nov. 16, 2005 (JP) ............................. 2005-331738
Jul. 21, 2006 (JP) ............................. 2006-199606

(51) Int. Cl.
*G01R 31/02* (2006.01)
(52) U.S. Cl. .................................... 324/763; 324/158.1
(58) Field of Classification Search ................. 324/763, 324/765, 158.1, 769, 761–762; 257/48
See application file for complete search history.

(56) References Cited
U.S. PATENT DOCUMENTS

| 5,712,576 A * | 1/1998 | Nagataki .................... 324/763 |
| 6,885,212 B2 | 4/2005 | Yamamoto et al. |
| 7,030,639 B2 * | 4/2006 | Ueminami et al. .......... 324/765 |
| 2005/0156589 A1 | 7/2005 | Yamamoto et al. |

* cited by examiner

*Primary Examiner*—Ha Nguyen
*Assistant Examiner*—Tung X Nguyen
(74) *Attorney, Agent, or Firm*—Posz Law Group, PLC

(57) ABSTRACT

A semiconductor integrated circuit includes: a package; semiconductor chips in the package including a signal terminal; and a wiring connecting signal terminals. One semiconductor chip is a test object chip including a probe terminal and a test object terminal. The probe terminal connects to an external terminal for testing the test object terminal. The test object chip further includes: a common wiring for connecting the probe terminal and the test object terminal; a first switch for connecting/disconnecting the probe terminal and the common wiring; a second switch for connecting/disconnecting the test object terminal and the common wiring; and a test signal interrupting element for interrupting the test signal to be inputted into an input circuit of the probe terminal.

6 Claims, 4 Drawing Sheets

SEMICONDUCTOR INTEGRATED CIRCUIT HAVING MULTIPLE SEMICONDUCTOR CHIPS WITH SIGNAL TERMINALS

CROSS REFERENCE TO RELATED APPLICATIONS

This application is based on Japanese Patent Applications No. 2005-331738 filed on Nov. 16, 2005, and No. 2006-199606 filed on Jul. 21, 2006, the disclosures of which are incorporated herein by reference.

FIELD OF THE INVENTION

The present invention relates to a semiconductor integrated circuit having multiple semiconductor chips with signal terminals.

BACKGROUND OF THE INVENTION

A multi-chip package (hereinafter called MCP) for storing the plural semiconductor chips to one package has merits in that cost is reduced by combining chips formed by device processes of different kinds and forming one package, and memory capacity can be simply increased by combining plural memory devices, etc. Further, in IC, the number of signal terminals exposed to the exterior of the package is limited by a package size. Namely, the number of terminals able to be arranged is determined in accordance with the length of each side in a plastic package of a rectangular shape.

Such a semiconductor integrated circuit generally has many functions. Accordingly, there is a tendency in which the number of signal terminals is also increased. Therefore, the limit of the number of terminals able to be arranged tends to become a problem. With respect to signals transmitted between plural chips, inter-chip wiring for connecting both signal terminals in the package interior is performed. However, with respect to a pad (signal terminal) in which the inter-chip wiring is performed, it becomes difficult to inspect electric characteristics in a package state (MCP state). Therefore, it is necessary to cope with this problem by arranging a special construction so as to make these inspections.

As mentioned above, for example, there is a semiconductor device disclosed in U.S. Pat. No. 6,885,212 as a technique for making the inspection with respect to the signal terminal in which the inter-chip wiring is performed. As shown in FIG. 4, this semiconductor device respectively has switch portions SW0, SW1, SW2, . . . between a common line L0 and signal terminals constructed by a probe terminal P0 connected to an external terminal and plural non-probe terminals P1, P2, . . . not connected to the external terminal. This semiconductor device is constructed so as to arbitrarily select a measuring object terminal from the plural non-probe terminals by a combination of conducted switch portions.

For example, when the non-probe terminal P1 is inspected, switch portions SW1 and SW0 corresponding to this terminal P1 and the probe terminal P0 are conducted and both these terminals are connected. Thus, the characteristic inspection of the non-probe terminal P1 is made through the probe terminal P0.

Namely, the above construction corresponds to an input-output compression test for commonly inputting and outputting a test signal through the probe terminal P0. A signal inputted to one of the non-probe terminals P1, P2, . . . is also commonly inputted to the probe terminal P0. Accordingly, for example, when the inspection is made with respect to the non-probe terminal P1, cases in which a set input voltage range is different from that of the probe terminal P0 and an input level to the probe terminal P0 becomes an intermediate electric potential if the non-probe terminal P1 has an analog input, are supposed. Thus, a through electric current is generated in an input buffer I0 connected to the probe terminal P0, and a problem of reliability for a long period and a problem unable to accurately inspect the non-probe terminal P1 are considered.

SUMMARY OF THE INVENTION

In view of the above-described problem, it is an object of the present disclosure to provide a semiconductor integrated circuit having multiple semiconductor chips with signal terminals.

According to an aspect of the present disclosure, a semiconductor integrated circuit includes: a package; a plurality of semiconductor chips disposed in the package, wherein each semiconductor chip includes a signal terminal; and a wiring for connecting signal terminals of two semiconductor chips of the semiconductor chips, wherein one of the two semiconductor chips is defined as a test object chip, the signal terminal of which is to be tested. The signal terminal of the test object chip includes a probe terminal and a test object terminal. The probe terminal connects to an external terminal so that the test object terminal is tested through the external terminal. The test object chip further includes: a common wiring for connecting the probe terminal and the test object terminal; a first switch for connecting and disconnecting the probe terminal and the common wiring; a second switch for connecting and disconnecting the test object terminal and the common wiring; and a test signal interrupting element for interrupting the test signal to be inputted into an input circuit of the probe terminal.

In the above device, even if an input voltage range of the probe terminal is different from that of the test object terminal, the test signal to be inputted into the input circuit is interrupted. Accordingly, through current does not flow in the input circuit. Therefore, long time reliability is not reduced, and examination of the test object terminal is accurately performed.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
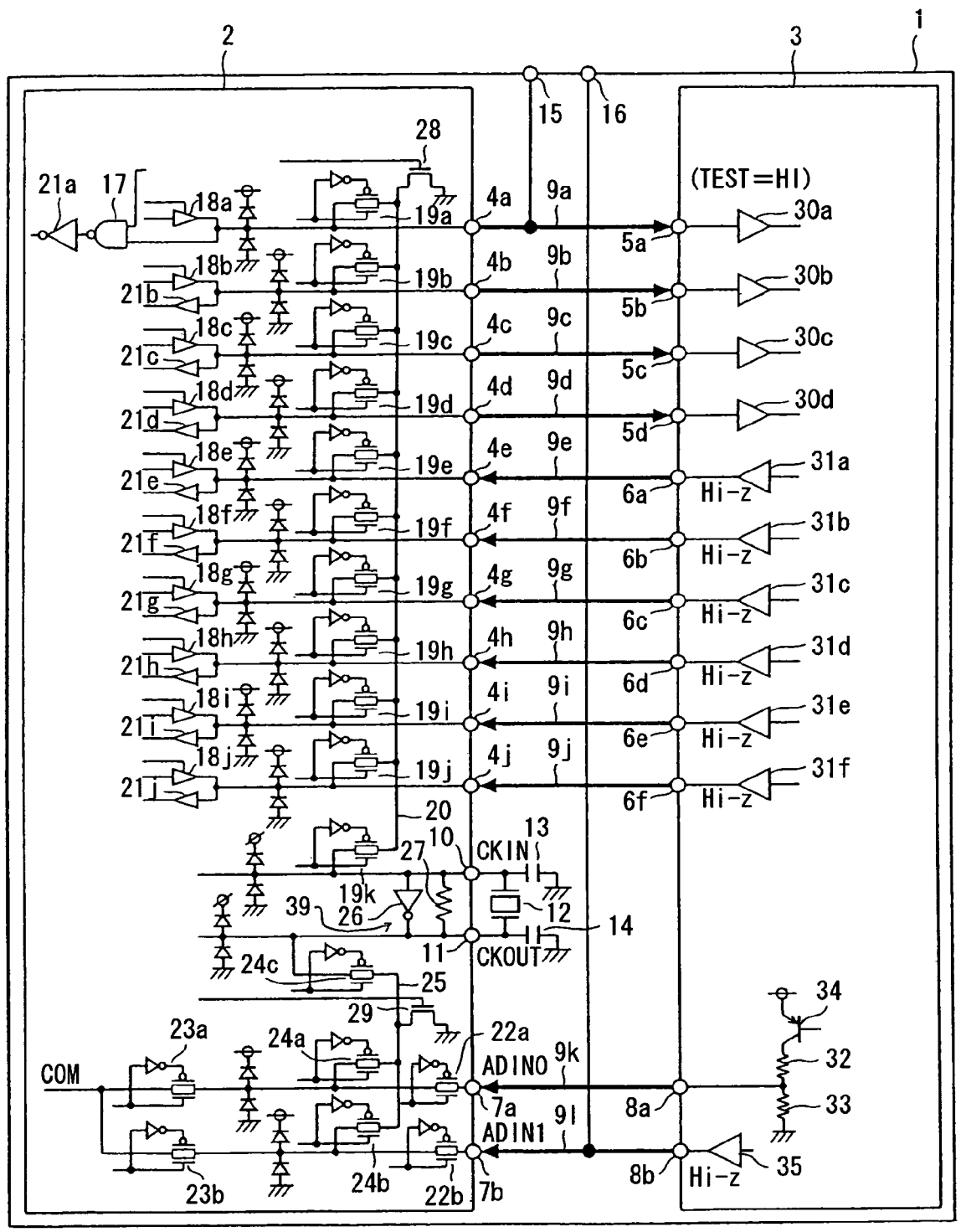
FIG. 1 is a circuit diagram showing a main part of a semiconductor integrated circuit.
Figure 2:
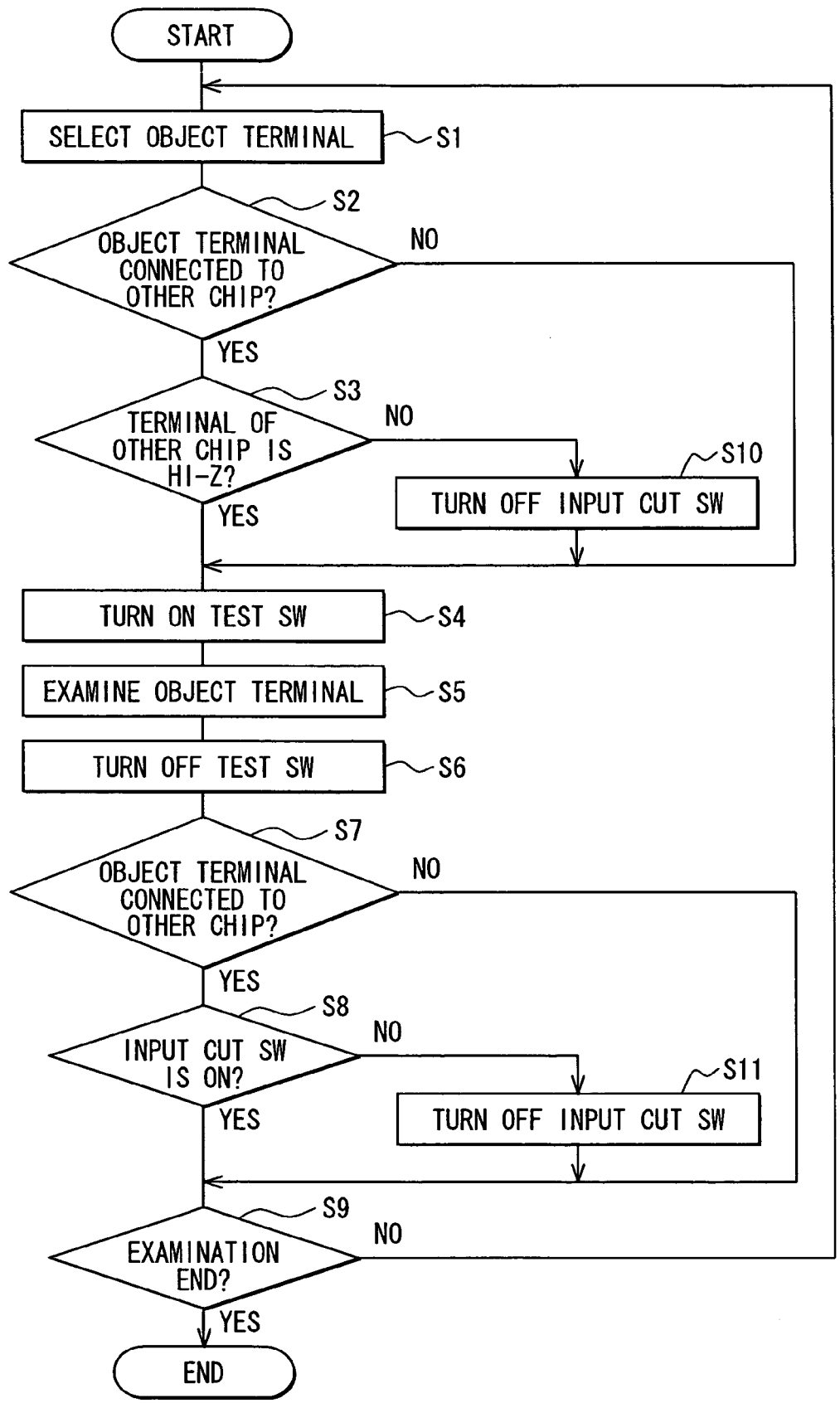
FIG. 2 is a flow chart explaining a method for inspecting terminal characteristics in the circuit.

A first embodiment of the present disclosure will next be explained with reference to FIGS. 1 and 2. FIG. 1 shows only portions relative to features in the construction of a semiconductor integrated circuit. As shown in FIG. 1, two semiconductor chips 2, 3 are mounted to the semiconductor integrated circuit 1. Signal terminals 4a to 4d of the semiconductor chip 2 and input terminals 5a to 5d of the semiconductor chip 3, signal terminals 4*e* to 4*j* of the semiconductor chip 2 and output terminals 6*a* to 6*f* of the semiconductor chip 3, and AD input terminals 7*a*, 7*b* of the semiconductor chip 2 and output terminals 8*a*, 8*b* of the semiconductor chip 3 are respectively connected by inter-chip wirings 9*a* to 9*l*. For example, the semiconductor chip 2 is constructed as a microcomputer, and the semiconductor chip 3 is constructed as a driver for inputting and outputting signals.

A liquid crystal oscillator 12 is connected between clock terminals 10 and 11 of the semiconductor chip 2, and both of its ends are connected to GND through capacitors 13, 14. In this embodiment, the semiconductor chip 2 becomes an inspecting object chip. The signal terminals 4*a* and 7*b* of the semiconductor chip 2 are connected to external terminals 15, 16 pulled out to the exterior of a package so that these signal terminals 4*a* and 7*b* become probe terminals. Terminals 4*b* to 4*j*, 7*a*, 10, 11 except for these probe terminals 4*a*, 7*b* become non-probe terminals.

Next, a circuit construction within the semiconductor chip 2 will be explained. The signal terminal 4*a* as a probe terminal is connected to one input terminal of a NAND gate 17 (inspecting signal interrupting means) and an output terminal of an output buffer 18*a* in the interior of the chip. The signal terminal 4*a* is also connected to a common line 20 through a test switch 19*a* (switch means).

The operation of the NAND gate 17 is controlled by a control signal showing a state of the test switch. Namely, when all test switches 19*a* to 19*k* are turned off, a control signal (not shown in the drawings) showing an H-level is given to the other input terminal of the NAND gate 17. When one of the test switches 19*a* to 19*k* is turned on, a control signal (not shown in the drawings) showing an L-level is given to the other input terminal of the NAND gate 17. If this control signal is the L-level, an input cut function for interrupting an input signal from the signal terminal 4*a* becomes valid. In contrast to this, if this control signal is the H-level, the input signal from the signal terminal 4*a* is supplied to an input buffer 21*a* connected to an output terminal of the NAND gate 17.

Further, signal terminals 4*b* to 4*j* are connected to output terminals of output buffers 18*b* to 18*j* and input terminals of input buffers 21*b* to 21*j* respectively corresponding to these signal terminals 4*b* to 4*j* in the chip interior. The signal terminals 4*b* to 4*j* are also connected to the common line 20 through test switches 19*b* to 19*j* (switch means).

Analog input terminals 7*a*, 7*b* are respectively connected to input cut switches 22*a*, 22*b* (external signal interrupting means) in the chip interior. The other ends of these input cut switches 22*a*, 22*b* are connected to selecting switches 23*a*, 23*b* respectively corresponding to these input cut switches 22*a*, 22*b*, and are connected to a common line 25 through test switches 24*a*, 24*b* (switch means). The other ends of these selecting switches 23*a*, 23*b* are commonly connected and select an input signal of one of the analog input terminals 7*a*, 7*b* and supply the selected input signal to an internal circuit (e.g., A/D converting circuit).

An inverter gate 26 and a feedback resistor 27 are connected in the chip interior between the clock terminals 10 and 11, and constitute a liquid crystal oscillating circuit 39 together with the liquid crystal oscillator 12 connected to the exterior and the capacitors 13, 14. Protecting circuits constructed by diodes are respectively connected to the above signal terminals 4*a* to 4*j*, clock terminals 10, 11 and analog input terminals 7*a*, 7*b* in the chip interior.

Here, input or output voltage ranges of the signal terminals 4*a* to 4*j* and the analog input terminals 7*a*, 7*b* as input-output terminals are set to 0 to +5 V so as to secure a level required as an interface signal transmitted between chips. Further, a clock signal generated in the above liquid crystal oscillating circuit is used as a clock of the interior of the semiconductor chip 2. Therefore, its maximum amplitude is set to +3.3 V equal to a power source voltage supplied to a core portion of the semiconductor chip 2. The clock terminal 10 is connected to the common line 20 through the test switch 19*k* (switch means), and the clock terminal 11 is connected to the common line 25 through the test switch 24*c* (switch means).

N-channel MOSFETs 28, 29 (predetermined electric potential giving means) are respectively connected between the common lines 20, 25 and GND. When all the test switches 19*a* to 19*k* are turned off, MOSFET 28 is turned on (the common line 20 has a GND electric potential). When all the test switches 24*a* to 24*c* are turned off, MOSFET 29 is turned on (the common line 25 has the GND electric potential). Thus, it is avoided that the electric potentials of the common lines become indefinite.

Here, turning-on and turning-off operations of test switches 19*a* to 19*k*, 24*a* to 24*c* and input cut switches 22*a*, 22*b* are controlled by an CPU not shown in the drawings. Namely, the turning on and turning-off operations are controlled by writing data to a control register (not shown in the drawings) by the CPU. Further, test switches 19*a* to 19*k*, 24*a* to 24*c* and input cut switches 22*a*, 22*b* are constructed by analog switches.

Next, the internal construction of the semiconductor chip 3 will be explained. Input terminals 5*a* to 5*d* of the semiconductor chip 3 are connected to input terminals of input buffers 30*a* to 30*d* in the chip interior. Further, output terminals 6*a* to 6*f* are connected to output terminals of output buffers 31*a* to 31*f*. These output buffers 31*a* to 31*f* are constructed so as to set their outputs to a Hi-Z (high impedance) state.

An output terminal 8*a* is connected to resistors 32, 33 in the chip interior, and the other end of the resistor 32 is connected to a collector terminal of a PNP transistor 34. The other end of the resistor 33 is connected to GND. An emitter terminal of this transistor 34 is connected to +5 V as a power source voltage of the semiconductor chip 3. An output signal from an internal circuit (not shown in the drawings) is inputted to a base terminal of the transistor 34. The output terminal 8*a* outputs a voltage dividing electric potential generated in accordance with an electric current flowed to the resistors 32, 33 through the transistor 34 by controlling a base electric current by the above output signal. Further, an output terminal 8*b* is connected to an output terminal of an output buffer 35, and this output buffer 35 can also set its output to the Hi-Z state.

Next, the operation of this embodiment will be explained by also referring to FIG. 2. FIG. 2 is a flow chart showing a procedure when a signal terminal of the semiconductor chip 2 is inspected. At a normal operation time including an inspection starting time (a starting time within the flow chart), all the test switches 19*a* to 19*k*, 24*a* to 24*c* of the semiconductor chip 2 are turned off, and the input cut switches 22*a*, 22*b* are turned on, and FETs 28, 29 connected to the common lines 20, 25 are also turned on (the common lines 20, 25 are set to the GND electric potential). Further, the semiconductor chip 3 side is set to a test mode (TEST=HI) in advance. As its result, as shown in FIG. 1, the outputs of output buffers 31*a* to 31*f*, 35 attain the Hi-Z state.

First, a case for making an inspection through the signal terminal 4*a* as a probe terminal with respect to the clock terminal 10 having a voltage range of 0 to +3.3 V will be explained along the flow chart of FIG. 2. An operator selects a signal terminal for making the inspection (step S1). In this case, an inspecting object terminal is the clock terminal 10, and is not connected to any terminal of the semiconductor chip 3 ("NO" in step S2). Accordingly, when the test switch 19k corresponding to the clock terminal 10 and the test switch 19a corresponding to the signal terminal 4a are turned on (step S4), the input cut function of the NAND gate 17 becomes valid and a signal path between the signal terminal 4a as a probe terminal and the input buffer 21a is interrupted, and FET 28 is turned off. Thus, the clock terminal 10 as an inspecting object terminal and the signal terminal 4a as a probe terminal are connected through the common line 20.

Accordingly, even when the signal terminal 4a and the clock terminal 10 having different terminal voltage ranges are connected through the common line 20, an input signal from the signal terminal 4a is interrupted in the input buffer 21a, and no through electric current caused by an electric potential difference between the above terminals is generated. Terminal characteristics of the clock terminal 10 are then inspected from the external terminal 15 through the signal terminal 4a. Namely, measurements of input and output electric current values and an output voltage, etc. are made by an test device (not shown in the drawings) connected to the external terminal 15 (step S5).

When the above inspection is terminated, FET 28 is turned on and the common line 20 attains the GND electric potential by turning-off the test switches 19a, 19k (step S6). Further, the input cut function of the NAND gate 17 also becomes invalid, and a signal inputted to the signal terminal 4a is supplied to the input buffer 21a. The clock terminal 10 set to an inspecting object is not connected to any terminal of the semiconductor chip 3 ("NO" in step S7). Accordingly, when the inspection is terminated ("YES" in step S9), a work is terminated as it is. In contrast to this, when the inspection is subsequently made ("NO" in step S9), it is returned to step S1 and a terminal is inspected in a procedure similar to that of the above case.

Next, a case for inspecting the analog input terminal 7a to which an analog signal outputted from the semiconductor chip 3 is given through the analog input terminal 7b as a probe terminal will be explained. First, similar to the inspection of the above clock terminal 10, an operator selects a terminal set to an inspecting object (step S1). However, in this case, since the analog input terminal 7a is connected to the output terminal 8a of the semiconductor chip 3 ("YES" in step S2), output setting of the output terminal 8a is confirmed (step S3). No output terminal 8a can set to the Hi-Z state since voltage dividing electric potentials of the resistors 32, 33 are directly outputted ("NO" in step S3). Accordingly, the input cut switch 22a arranged between the analog input terminal 7a and an internal circuit of the selecting switch 23a, etc. is turned off, and a signal input from the output terminal 8a is interrupted (step S10).

Next, when the test switches 24a, 24b corresponding to the analog input terminals 7a, 7b are respectively turned on (step S4), FET 29 is turned off and both the terminals are connected through the common line 25. Further, at an inspecting time of this analog input terminal 7a, the selecting switch 23b corresponding to the analog input terminal 7b is always turned off. Therefore, a signal input from the analog input terminal 7b is interrupted by the selecting switch 23b and terminal characteristics of the analog input terminal 7a can be inspected from the external terminal 16 through the analog input terminal 7b. Namely, the measurement of an input electric current value, etc. are made with respect to an internal circuit side terminal of the input cut switch 22a (step S5).

When the above inspection is terminated, FET 29 is turned on and the common line 25 attains the GND electric potential by turning-off the test switches 24a, 24b (step S6). In this case, since the signal output from the output terminal 8a of the semiconductor chip 3 connected to the analog input terminal 7a is interrupted ("YES" in step S7 and "NO" in step S8), the input cut switch 22a is turned on (step S11) and it is returned to a state in which the output signal from the output terminal 8a is inputted to the internal circuit through the analog input terminal 7a. When the inspection is then terminated ("YES" in step S9), a work is terminated as it is. In contrast to this, when the inspection is subsequently made ("NO" in step S9), it is returned to step S1.

As mentioned above, in accordance with the semiconductor integrated circuit 1 of this embodiment, when the clock terminal 10 having a voltage range of 0 to +3.3 V is connected to the signal terminal 4a having an input voltage range of 0 to +5 V as a probe terminal and the inspection is made, a signal input to the input buffer 21a corresponding to the signal terminal 4a is interrupted by setting the input cut function of the NAND gate 17 to be valid. Accordingly, it is prevented to flow a through electric current to the input buffer 21a, and a non-probe terminal can be accurately inspected without reducing reliability for a long period.

Further, when all the respective test switches 19a to 19k, 24a to 24c are turned off, the GND electric potential is given to the common lines 20, 25 by setting the N-channel MOSFETs 28, 29 to a turning-on state. Accordingly, it is possible to avoid that the electric potentials of the common lines 20, 25 become indefinite.

Further, even when no output of the output terminal 8a of the semiconductor chip 3 connected to the analog input terminal 7a can be set to the Hi-Z state in inspecting this analog input terminal 7a as a non-probe terminal of the semiconductor chip 2, the signal input from the output terminal 8a is interrupted by turning-off the input cut switch 22a arranged between the analog input terminal 7a and the internal circuit. Accordingly, the analog input terminal 7a can be inspected without being influenced by an output state of the output terminal 8a.

Figure 3:
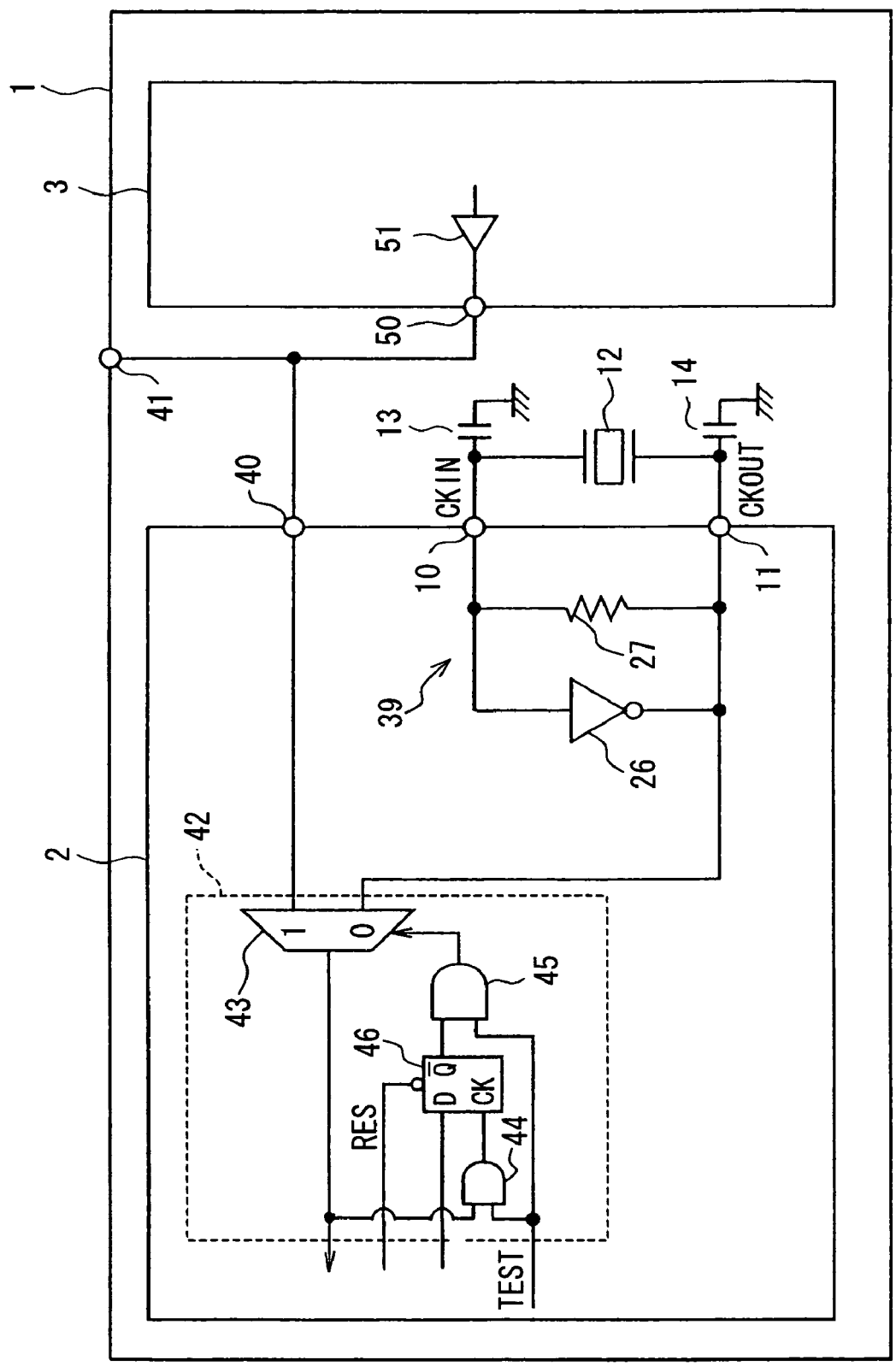
FIG. 3 is a circuit diagram showing a main part of another semiconductor integrated circuit.
Figure 4:
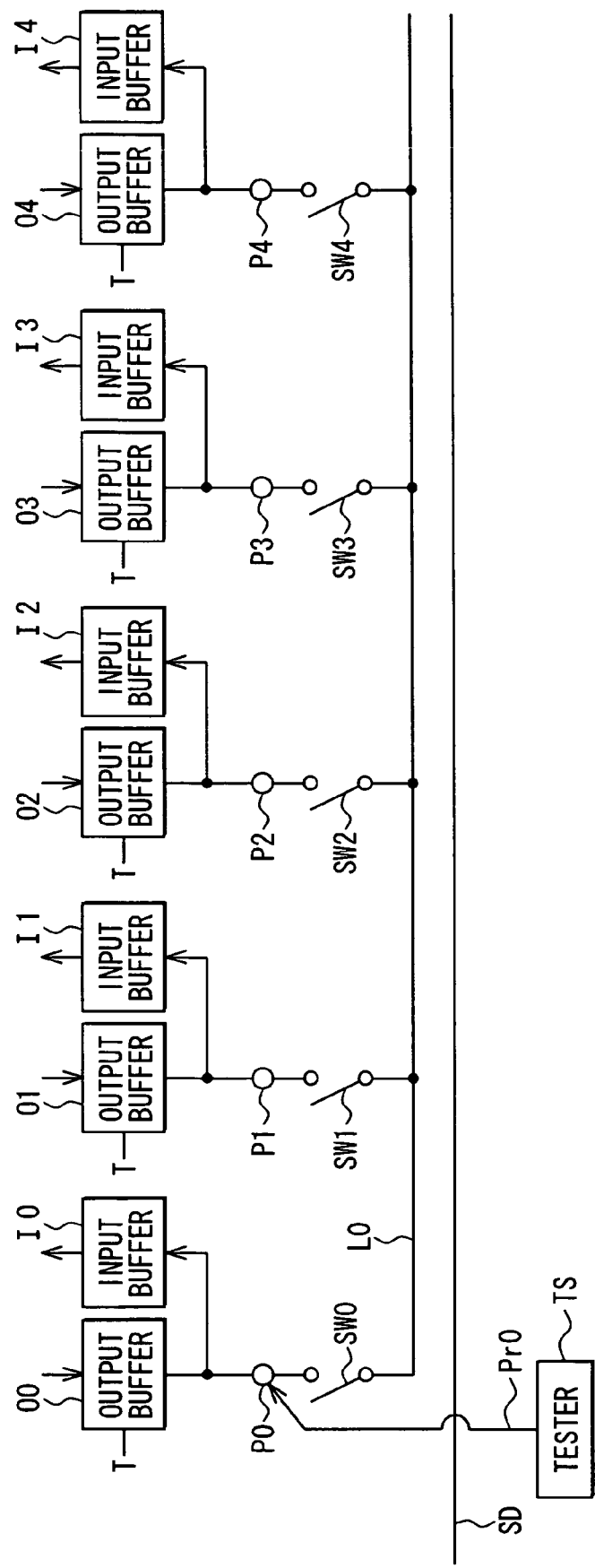
FIG. 4 is a circuit diagram showing a main part of a semiconductor integrated circuit according to a prior art.

FIG. 3 shows a second embodiment of the present disclosure. FIG. 3 shows one portion of the semiconductor integrated circuit 1 shown in FIG. 1, and shows a portion relative to the input of a clock signal for an operation and its peripheral portion.

A semiconductor chip 2 has an external clock terminal 40, and this external clock terminal 40 is connected to an external terminal 41 pulled out to the exterior of a package. Thus, a clock signal for an inspection can be inputted to the semiconductor chip 2 from the exterior. Further, the semiconductor chip 2 has a clock selecting circuit (corresponding to a selecting circuit) 42 for selecting one of the above external clock terminal 40 and the clock terminal 11 as a clock output of a liquid crystal oscillating circuit (corresponding to an oscillating circuit) 39, and connecting the selected terminal to a clock input line of a personal internal circuit (e.g., an internal logic of a CPU, etc.) not shown in the drawings.

The clock selecting circuit 42 is constructed by arranging a selector 43, AND gates 44, 45 and a latch circuit (D-flip flop) 46. The external clock terminal 40 is connected to one input terminal of the selector 43, and the clock terminal 11 is connected to the other input terminal. Further, an output terminal of the selector 43 is connected to a clock input line of an internal circuit not shown in the drawings, and is also connected to one input terminal of the AND gate 44. An output terminal of the AND gate 44 is connected to a clock terminal CK of the latch circuit 46.

Data are given from the CPU not shown in the drawings as the internal circuit of the semiconductor chip 2 to a data terminal D of the latch circuit 46. An output terminal Q bar is connected to one input terminal of the AND gate 45. Further, in the latch circuit 46, data "0" are given to the data terminal D in an initial state. In reality, a logic circuit not shown in the drawings is interposed between an output port of the CPU and the latch circuit 46, and the data outputted to the data terminal D by the CPU are set to be held.

A TEST signal is given to the other input terminal of the AND gates 44, 45. This TEST signal is a signal for setting the semiconductor chip 3 to a test mode (TEST=HI) as described in the first embodiment. An output terminal of the AND gate 45 is connected to a select terminal of the selector 43. The selector 43 is constructed such that one input terminal (1) is selected when a signal inputted to the select terminal is a H-level, and the other input terminal (0) is selected when this signal is an L-level.

On the other hand, an output terminal (corresponding to a signal terminal) 50 of the semiconductor chip 3 is connected to the external terminal 41 commonly to the external clock terminal 40 of the semiconductor chip 2. Further, an output terminal 50 is connected to an output terminal of an output buffer 51 in the interior of the semiconductor chip 3. This output buffer 51 is arranged to monitor an internal signal of the semiconductor chip 3 from the exterior.

Next, the operation of the second embodiment will be explained. As explained in the first embodiment, when an inspection is made with respect to a signal terminal of the semiconductor chip 2, for example, an operator sets the TEST signal to be active by setting a predetermined external terminal of the semiconductor integrated circuit 1 to the H-level. However, thus, the other input terminal of the AND gates 44, 45 in the clock selecting circuit 42 attains the H-level. When reset of the latch circuit 46 is released in the semiconductor chip 2, the level of the output terminal Q bar attains the high (H) level, and is given to the select terminal of the selector 43 through the AND gate 45.

The selector 43 selects the external clock terminal 40 side connected to the input terminal (1) by setting the select terminal to become the H-level. Accordingly, in this state, the operator can input a clock signal for an inspection outputted by e.g., an LSI tester, etc. from the external terminal 41. Thus, the clock signal for an inspection is supplied to the internal circuit of the semiconductor chip 2, and the above internal circuit can be operated in synchronization with the clock signal for an inspection. Namely, when the inspection is made similarly to the first embodiment, operation timing (e.g., signal output timing, etc.) of the semiconductor chip 2 can be monitored by an external LSI tester, etc. Accordingly, it is also possible to confirm whether this operation timing satisfies a design specification.

Further, when the internal circuit of the semiconductor chip 2 is operated by a clock signal generated by the liquid crystal oscillating circuit 39 and its operating state is confirmed at the inspecting time, data "1" are set to the latch circuit 46 by the CPU of the semiconductor chip 2, and the output terminal Q bar is set to the L-level. Thus, the selector 43 selects the clock terminal 11 side. Thus, a clock signal generated in the liquid crystal oscillating circuit 39 is supplied to the internal circuit of the semiconductor chip 2.

On the other hand, when the semiconductor integrated circuit 1 is normally operated, for example, the operator sets the TEST signal to be inactive by setting a predetermined external terminal of the semiconductor integrated circuit 1 to the L-level. Thus, since the selector 43 of the semiconductor chip 2 selects the clock terminal 11 side, the clock signal generated in the liquid crystal oscillating circuit 39 is supplied to the internal circuit of the semiconductor chip 2. Further, the semiconductor chip 3 is also set to a normal operation mode, and all output buffers including the output buffer 51 attain a normal output state.

In this state, the operator can then monitor an output state of the output terminal 50 of the semiconductor chip 3 from the external terminal 41. Further, if the semiconductor chip 2 side is also set to a reset state and its operation is stopped at the inspecting time (TEST=HI), the output state of the output terminal 50 can be monitored similarly to the above case.

As mentioned above, in accordance with the second embodiment, if the TEST signal given to the semiconductor integrated circuit 1 is set to be active and is set to an inspecting mode in making the inspection with respect to the semiconductor chip 2, the clock selecting circuit 42 selects the external clock terminal 40 side in an initial state. Hence, the operator can operate the internal circuit by supplying the clock signal for an inspection from the external terminal 41. Accordingly, the internal operation of the semiconductor chip 2 can be controlled from the exterior by synchronizing operation timing of the internal circuit with the clock signal for an inspection. Thus, output timing of a signal, etc. can be also confirmed.

Further, in the above inspecting state, the selection of the external clock terminal 40 and the clock terminal 11 can be switched in the clock selecting circuit 42. Accordingly, if the clock terminal 11 side is switched so as to be selected in accordance with necessity, the clock signal generated by the liquid crystal oscillating circuit 39 can be also supplied to the semiconductor chip 2. Accordingly, the inspection can be also made in a state in which the internal circuit of the semiconductor chip 2 is operated by the clock signal generated by the liquid crystal oscillating circuit 39.

Further, since the external clock terminal 40 is also connected to the output terminal 50 of the semiconductor chip 3, the external terminal 41 can be also used as a probe terminal for confirming a state of an internal signal of the semiconductor chip 3 at the normal operation time of the semiconductor integrated circuit 1. Further, if the operation of the semiconductor chip 2 side is also stopped in the inspecting mode of the semiconductor chip 2, the state of the internal signal of the semiconductor chip 3 can be confirmed similarly to the above case.

The present disclosure is not limited to the respective embodiments mentioned above and described in the drawings, but can be modified or extended as follows.

An electric power source system of the signal terminal may be also set to three kinds or more.

The electric power source amplitude of a signal terminal is not limited to the above case, but, for example, the power source voltage supplied to the core portion of the semiconductor chip 2 may be also set to +2.5 V or +1.5 V.

The probe terminal may be connected to the exterior, and may be also a terminal connected between chips, and may be also a terminal which is not connected between the chips and is directly connected to the exterior.

The turning-on and turning-off controls of the test switches 19*a* to 19*k*, 24*a* to 24*c* may be also individually performed and may be also collectively performed.

The test switch may be also arranged in a terminal except for the probe terminal and the non-probe terminal.

Turning-on and turning-off of electric potential setting FETs 28, 29 may be also able to be set by a control register.

The inspecting signal interrupting means is constructed by the NAND gate 17. However, it is sufficient to be able to prevent the through electric current when one input of the NAND gate 17 has an intermediate electric potential. Accordingly, the NAND gate 17 may be also constructed by a NOR type.

Three semiconductor chips or more may be also mounted.

In the above embodiments, the predetermined electric potential giving means is constructed by the N-channel MOSFET, and the GND electric potential is given to the common lines 20, 25. However, the predetermined electric potential giving means may be also constructed by a P-channel MOSFET and e.g., an electric potential of +5 V, etc. may be also given to the common lines 20, 25. Further, the predetermined electric potential giving means may be also constructed by an analog switch.

It is sufficient to arrange at least one probe terminal.

If all terminal outputs of the other chip side connected to the non-probe terminal can be set to the Hi-Z state, it is not necessary to arrange the input cut switch.

For example, the semiconductor chip 3 may be also a memory such as EEPROM, etc.

For example, the liquid crystal oscillator 12 may be also an oscillator such as a ceramic oscillator, etc.

The switch means and the inspecting signal interrupting means may be arranged in at least one of the two semiconductor chips 2, 3 connected by the inter-chip wiring.

The external clock terminal 40 of the semiconductor chip 2 may be also set to a construction connected to an input terminal or input and output terminals of the semiconductor chip 3. In accordance with such a construction, a signal for a test can be inputted from the external terminal 41 to the semiconductor chip 3.

The clock selecting circuit 42 of the second embodiment may be also arranged on the clock terminal 10 side.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor integrated circuit comprising:
   a package;
   a plurality of semiconductor chips disposed in the package, wherein each semiconductor chip includes a signal terminal; and
   a wiring for connecting signal terminals of two semiconductor chips of the semiconductor chips, wherein one of the two semiconductor chips is defined as a test object chip, the signal terminal of which is to be tested, wherein
   the signal terminal of the test object chip includes a probe terminal and a test object terminal,
   the probe terminal connects to an external terminal so that the test object terminal is tested through the external terminal, and
   the test object chip further includes:
      a common wiring for connecting the probe terminal and the test object terminal;
      a first switch for connecting and disconnecting the probe terminal and the common wiring;
      a second switch for connecting and disconnecting the test object terminal and the common wiring; and
      a test signal interrupting element for interrupting the test signal to be inputted into an input circuit of the probe terminal,
   wherein the test object chip further includes a signal interrupting element for interrupting a signal, which is to be inputted into the test object terminal of the test object chip from other semiconductor chips.

2. The circuit according to claim 1, wherein
the test object chip further includes an electric potential applying element for applying a predetermined electric potential to the common wiring.

3. A semiconductor integrated circuit comprising:
   a package;
   a plurality of semiconductor chips disposed in the package, wherein each semiconductor chip includes a signal terminal; and
   a wiring for connecting signal terminals of two semiconductor chips of the semiconductor chips, wherein one of the two semiconductor chips is defined as a test object chip, the signal terminal of which is to be tested, wherein
   the signal terminal of the test object chip includes a probe terminal and a test object terminal,
   the probe terminal connects to an external terminal so that the test object terminal is tested through the external terminal, and
   the test object chip further includes:
      a common wiring for connecting the probe terminal and the test object terminal;
      a first switch for connecting and disconnecting the probe terminal and the common wiring;
      a second switch for connecting and disconnecting the test object terminal and the common wiring;
      a test signal interrupting element for interrupting the test signal to be inputted into an input circuit of the probe terminal;
      an oscillation circuit for generating a clock signal and for supplying the clock signal to the test object chip;
      an external clock terminal connecting to an external circuit so that an external clock signal is inputted into the test object chip from the external circuit; and
      a selecting circuit for selecting one of the external clock terminal and the oscillation circuit so that the clock signal or the external clock signal is supplied to the test object chip, wherein
   the selecting circuit selects the external clock terminal in an initial state of testing the test object terminal, and
   the selecting circuit selects the oscillation circuit when the test object terminal is not tested.

4. The circuit according to claim 3, wherein
the selecting circuit is capable of switching between the external clock terminal and the oscillation circuit when the test object terminal is tested.

5. The circuit according to claim 3, wherein
the external clock terminal is connected to the signal terminals of other semiconductor chips.

6. The circuit according to claim 3, wherein
the test object chip further includes an electric potential applying element for applying a predetermined electric potential to the common wiring.

* * * * *